US006955836B2

(12) United States Patent
Kumagai et al.

(10) Patent No.: US 6,955,836 B2
(45) Date of Patent: Oct. 18, 2005

(54) SILICON OXIDE FILM FORMATION METHOD

(75) Inventors: Akira Kumagai, Tokyo (JP); Keiji Ishibashi, Tokyo (JP); Shigeru Mori, Tokyo (JP)

(73) Assignees: Anelva Corporation, Tokyo (JP); NEC Corporation, Tokyo (JP)

( * ) Notice: Subject to any disclaimer, the term of this patent is extended or adjusted under 35 U.S.C. 154(b) by 76 days.

(21) Appl. No.: 10/326,092

(22) Filed: Dec. 23, 2002

(65) Prior Publication Data

US 2003/0118748 A1 Jun. 26, 2003

(30) Foreign Application Priority Data

Dec. 25, 2001 (JP) .......................................... 2001-392625

(51) Int. Cl.⁷ ............................................. C23C 16/40
(52) U.S. Cl. .................................. 427/579; 427/255.37
(58) Field of Search ............................. 427/579, 255.37

(56) References Cited

U.S. PATENT DOCUMENTS 5,904,573 A * 5/1999 Jang et al. .................. 438/758

FOREIGN PATENT DOCUMENTS

JP        2000345349 A * 12/2000 ........... C23C/16/50

* cited by examiner

*Primary Examiner*—Timothy Meeks
(74) *Attorney, Agent, or Firm*—Wenderoth, Lind & Ponack, L.L.P.

(57) ABSTRACT

A silicon oxide film formation method enhances the efficiency of generating atomic oxygen and improves film quality of a silicon film ($SiO_2$ film) in forming the silicon oxide film using an RS-CVD system. Nitrogen atom containing gas ($N_2$ gas, NO gas, $N_2O$ gas, $NO_2$ gas or the like) is added to oxygen atom containing gas ($O_2$ gas, $O_3$ gas or the like) introduced into a plasma generating space in a vacuum container to produce plasmas with these gases and to thereby increase the quantity of atomic oxygen generated by the plasmas in the plasma generating space.

4 Claims, 7 Drawing Sheets

SiO₂ formation reaction mechanism in film forming space

Dependency of Atomic Oxygen Flow Rate on Discharge Power
(Atomic Oxygen Flow Rate is measured in Film Forming Space)

Dependency of Intensity of Light Emitted (844.65nm) from Atomic Oxygen on Quantity of added $N_2O$ and $N_2$ gas Dependency of effective charge density Neff on Quantity of added $N_2O$ gas

SILICON OXIDE FILM FORMATION METHOD

BACKGROUND OF THE INVENTION

1. Field of the Invention

The present invention relates to a method for forming a silicon oxide film. More specifically, the present invention relates to a method for forming a silicon oxide film having improved quality by using a radical shower CVD system (RS-CVD system).

2. Description of the Related Art

At present, plasma CVD systems are employed to form silicon oxide suitable to a gate insulating film at low temperature in manufacturing a liquid crystal display which employs a low temperature polycrystalline silicon TFT.

Among those plasma CVD systems, there is known a CVD system proposed in Japanese Patent Unexamined Application Publication No. 2000-345349(JP-A-2000-345349), which is a prior patent application to this application. In this specification, this CVD system is referred to as "RS-CVD system", which is a Radical Shower CVD system, so as to differentiate this CVD system proposed in JP-A-2000-345349 from the ordinary CVD system. This RS-CVD system generates plasma in a vacuum container to generate electrically neutral, excited, active species (REFERRING to these electrically neutral, excited active species as "radicals" herein after in this specification) and form a film on a substrate by the radicals and material gas. Specifically, the vacuum container is separated into a plasma generating space and a film forming space using a partition plate which has a plurality of holes through which the radicals pass. Gas is introduced into the plasma generating space. Radicals are generated from plasmas and these generated radicals are introduced into the film forming space through the holes of the partition plate. Material gas is directly introduced into the film forming space (i.e., directly introduced from the outside of the vacuum container into the film forming space without contacting the material gas with the plasmas and radicals). The radicals and the material gas thus introduced into the film forming space are caused to react with each other in the film forming space, thereby forming a film on a substrate (which is, for example, a glass substrate of 370 mm×470 m) arranged in the film formation space.

The silicon oxide film formation reaction in the film forming space of the RS-CVD system of this type occurs by contacting atomic oxygen (excited active species) supplied from the plasma generating space to the film forming space with silane ($SiH_4$) gas in the film forming space thereby decomposing the silane gas, and repeating the reaction of the decomposed gas with atomic oxygen, oxygen gas or the like. In the attached FIG. 4, a typical view of these reactions is disclosed.

In other words, in the reaction process shown in FIG. 4, the atomic oxygen (excited active species) generated in the plasma generating space acts both as a trigger which triggers a series of formation reactions for a silicon oxide film and as a reactive species which makes reactions for forming the silicon oxide film.

From these facts, it is known that if the amount of the atomic oxygen introduced from the plasma generating space into the film forming space is small, intermediate products produced as a result of insufficient decomposition of the silane ($SiH_4$) gas mix in a film which is being formed, resulting in the degradation of the quality of the film.

It is possible to improve the efficiency of generating atomic oxygen, which plays an important role in this silicon oxide film formation process, by changing film formation conditions as follows.

FIG. 5 shows the dependency of the flow rate of atomic oxygen flowing from the plasma generating space to the film forming space and measured in the film forming space on discharge power (with a discharge frequency of 60 MHz). As is seen from FIG. 5, the atomic oxygen flow rate does not invariably increase even if discharge power increases and, after reaching a maximum at a discharge power of about 35 W, the atomic oxygen flow rate invariably decreases.

In addition, while the amount of the atomic oxygen generated in the plasma generating space increases as the amount of flow of oxygen gas introduced into the plasma generating space increases at first, it is known that the amount of the atomic oxygen reaches a maximum when the oxygen gas has a certain amount of flow. In the RS-CVD system shown in FIGS. 1 and 2, it is found that the atomic oxygen has a degree of dissociation of about 15% of the total introduced oxygen gas.

On the other hand, as a method for improving efficiency for generating atomic oxygen besides the method for optimizing film formation conditions, disclosed in the Japanese Patent Unexamined Application Publication No. 11-279773 (JP-A-11-279773) there is known a method for increasing the amount of atomic oxygen in plasmas by adding so-called noble gas such as helium (He), krypton (Kr) or argon (Ar).

If this method is used, however, the noble gas is added so as to be high in proportion relative to the oxygen gas.

To improve efficiency for generating target atomic oxygen, noble gas, e.g., krypton which is 20 times as large as oxygen gas or argon (Ar) gas which is 25 times as large as oxygen gas in quantity is added. It is assumed that atomic oxygen is generated by adding argon (Ar) and oxygen gas ($O_2$) at a ratio of argon to oxygen of, for example, 25:1. In this case, even if the oxygen gas has a degree of dissociation of 100%, the proportion of the generated atomic oxygen relative to the total amount of flowing argon and oxygen gas is less than 4% at most.

As stated above, there are some known methods for improving efficiency for generating atomic oxygen which play an important role in the silicon oxide film formation process. However, atomic oxygen cannot be obtained sufficiently only by optimizing silicon oxide film process parameters.

Furthermore, according to the method disclosed in the JP-A-279773, it is necessary to introduce an overwhelming quantity of noble gas relative to oxygen gas and create a noble gas atmosphere so as to improve the efficiency for generating atomic oxygen. Thus the proportion of generated oxygen gas relative to the total flow rate is low. In the present industry in which the areas of substrates become increasingly large, e.g., in a system which forms a silicon oxide film on a 1 meter size large area substrate, a large quantity of noble gas several times or several tens of times as large as that of oxygen gas must be introduced to generate atomic oxygen.

SUMMARY OF THE INVENTION

The present invention is intended to provide a method for improving efficiency for generating atomic oxygen to replace the above-stated conventional methods so as to improve the quality of a silicon oxide film ($SiO_2$ film) to be formed using an RS-CVD system.

The present invention has been made to solve the before-described conventional problems.

Therefore, it is an object of the present invention to provide an alternate silicon oxide film formation method for forming a silicon oxide film ($SiO_2$) film using an RS-CVD system, which includes adding a nitrogen atom containing gas to an oxygen atom containing gas introduced into a plasma generating space and increasing the quantity of atomic oxygen generated in the plasma generating space generated by plasmas.

Furthermore, the present invention demonstrates that the quantity of the gas (nitrogen atom containing gas) added to the oxygen atom containing gas is important. Therefore, it is another object of the present invention to provide a silicon oxide film formation method capable of efficiently, economically forming a good quality silicon oxide film even on a substrate which is becoming large in size.

The silicon oxide film formation method proposed by the present invention is a method for forming a silicon oxide film on a substrate using products produced by plasmas generated in a vacuum container and material gas, by employing the following CVD system (RS-CVD system).

A conductive partition plate separating an interior of a vacuum container into two spaces is provided in the vacuum container of this CVD system. The interior of one chamber thus separated from the other space is formed as a plasma generating space having a high frequency electrode arranged therein and that of the other chamber is formed as a film forming space having a substrate holding mechanism, on which a substrate is mounted, arranged therein. The conductive partition plate has a plurality of penetrating holes for communicating the plasma generating space with the film forming space and has an internal space separated from the plasma generating space and communicating with the film forming space through a plurality of diffusion holes. Material gas supplied from outside of the vacuum container into the internal space of the conductive partition plate is introduced into the film forming space through the diffusion holes. The products, i.e., radicals, which are generated by plasma discharge generated by applying high frequency power to the high frequency electrode, are introduced from the plasma generating space into the film forming space through the plurality of penetrating holes of the conductive partition plate. Thus, in the film forming space, a silicon oxide film is formed on the substrate using the products (radicals) and the material gas.

The silicon oxide film formation method according to the present invention is characterized in that during formation of the silicon oxide film, oxygen atom containing gas and nitrogen atom containing gas are introduced into the plasma generating space where the plasma discharge is made by applying high frequency power to the high frequency electrode.

The nitrogen atom containing gas introduced, together with the oxygen atom containing gas, into the plasma generating space is mixed into the oxygen atom containing gas preferably at a concentration of not more than 20%, more preferably 5 to 7%.

Further, $O_2$ or $O_3$, for example, can be used as the oxygen atom containing gas and any one of $N_2$, NO, $N_2O$ or $NO_2$ can be used as the nitrogen atom containing gas.

According to the silicon oxide film formation method of the present invention, only by adding a slight amount of nitrogen atom containing gas ($N_2$ gas, NO gas, $N_2O$ gas, $NO_2$ gas or the like) to oxygen atom containing gas ($O_2$ gas, $O_3$ gas or the like) introduced into the plasma generating space at a concentration of not more than 20%, optimally 5 to 7% relative to that of the oxygen atom containing gas, it is possible to nearly double the quantity of atomic oxygen in comparison with the case without adding nitrogen atom containing gas and to form a good silicon oxide film.

In this connection, therefore, according to the silicon oxide film formation method of the present invention, only by adding a simple structure which comprises a pipe, a valve, a flow rate regulator and the like for the nitrogen atom containing gas ($N_2$ gas, NO gas, $N_2O$ gas, $NO_2$ gas or the like), it is possible to economically, and efficiently form a good silicon oxide film even on a substrate which becomes increasingly large in size.

DESCRIPTION OF THE PREFERRED EMBODIMENTS

Preferred embodiments of the present invention will be described hereinafter with reference to the accompanying drawings.

Figure 1:
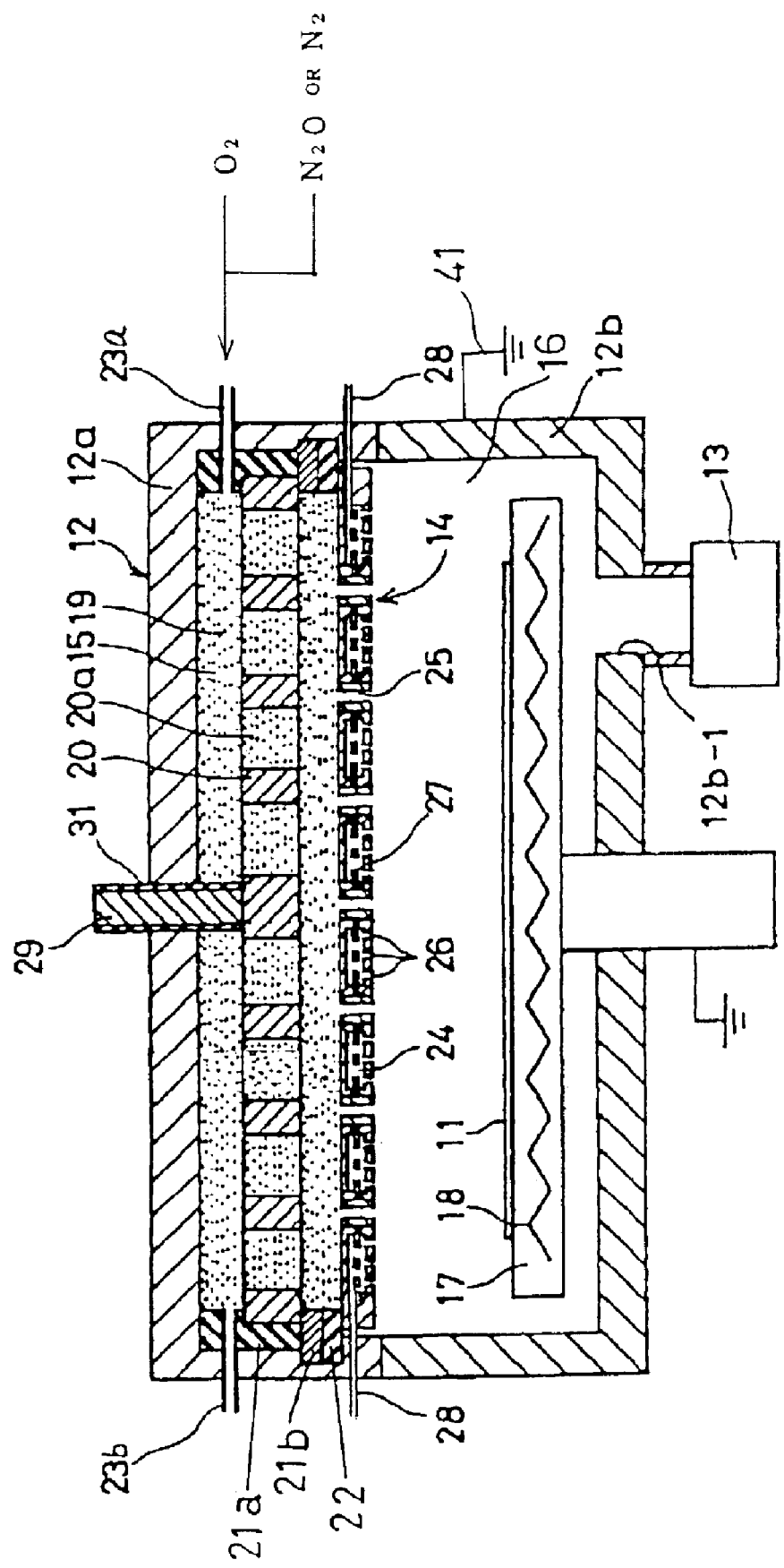
FIG. 1 is a cross-sectional view showing a first embodiment of an RS-CVD system employed for a silicon oxide film formation method according to the present invention.
Figure 2:
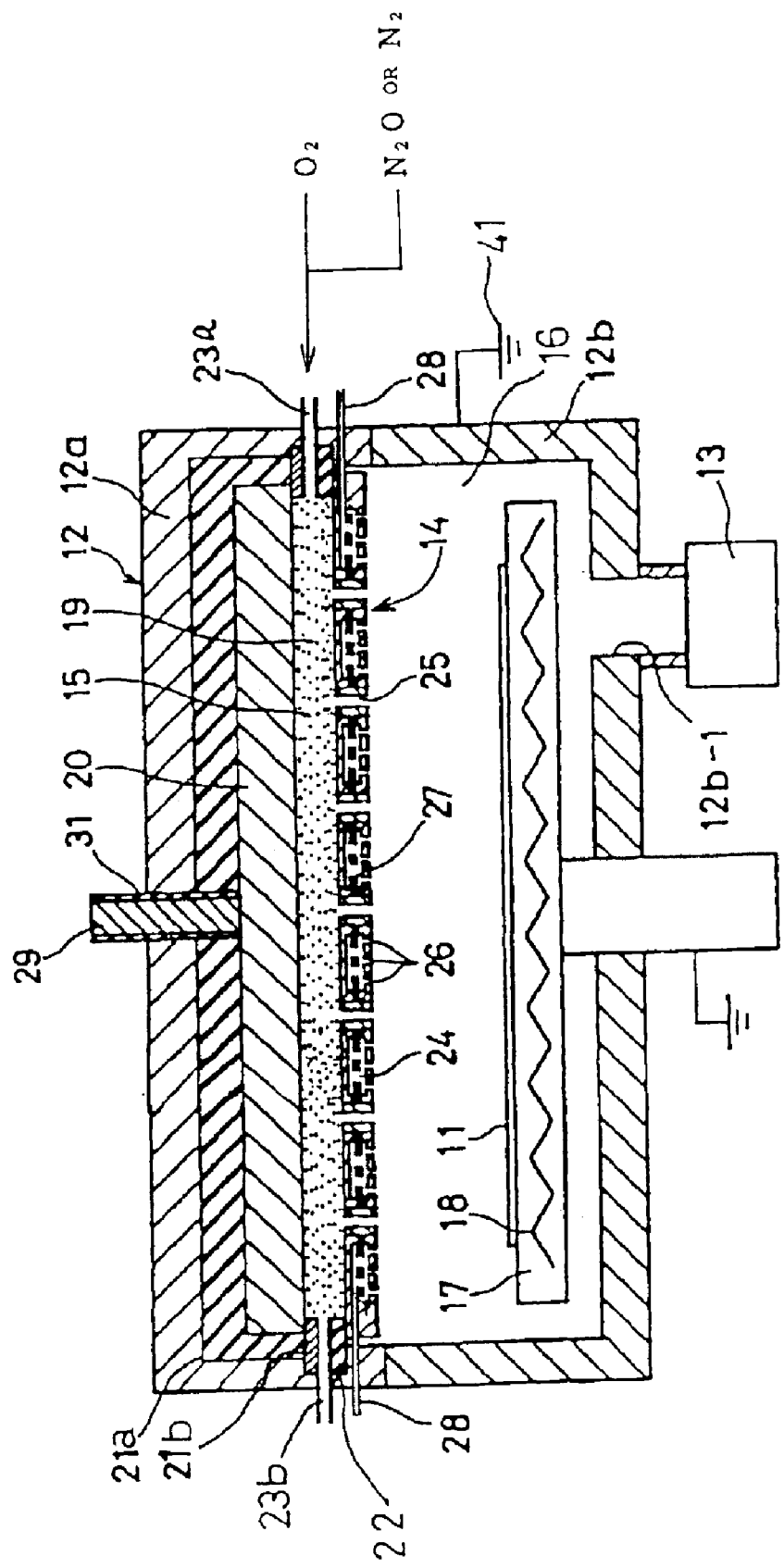
FIG. 2 is a cross-sectional view showing a second embodiment of the RS-CVD system employed for the silicon oxide film formation method according to the present invention.

A preferred embodiment of a CVD system (RS-CVD system) which can be employed for a silicon oxide film formation method according to the present invention will be described with reference to FIGS. 1 and 2. In FIGS. 1 and 2, this RS-CVD system preferably employs silane gas as material gas and forms a silicon oxide film as a gate insulating film on the upper surface of an ordinary TFT glass substrate 11.

A vacuum container 12 of the RS-CVD system is constituted so that the interior of the container 12 is held in vacuum by an exhaust mechanism 13. The exhaust mechanism 13 is connected to an exhaust port 12b-1 formed at the vacuum container 12.

A partition plate 14 made of a conductive member is provided horizontally in the vacuum container 12. The partition plate 14 in, for example, a rectangular plane is arranged so that the peripheral edge portions thereof are pressed against the lower surface of a conductive material fixing portion 22 to form a closed state.

Thus, the interior of the vacuum container 12 is separated into two spaces, i.e., upper and lower spaces, by the partition plate 14. The upper space forms a plasma generation space 15 and the lower space forms a film formation processing space 16.

The partition plate 14 has a desired, specific thickness and an entirely flat shape similar to that of the horizontal section of the vacuum container 12. An inner space 24 is formed in the partition plate 14.

The glass substrate 11 is provided on a substrate holding mechanism 17 provided in the film forming space 16. The glass substrate 11 is arranged so that it is substantially parallel to the partition plate 14 and the surface thereof, on which a film is formed, (upper surface) faces the lower surface of the partition plate 14.

The potential of the substrate holding mechanism 17 is held to be a ground potential 41 equal to that of the vacuum container 12. A heater 18 is provided in the substrate holding mechanism 17. This heater 18 can keep the temperature of the glass substrate 11 to a predetermined temperature.

The structure of the vacuum container 12 will be described. For the purpose of improving assemblage, the vacuum container 12 consists of an upper container 12a, which forms the plasma generating space 15, and a lower container 12b, which forms the film forming space 16. When the upper container 12a and the lower container 12b are to be assembled together to form the vacuum container 12, the partition plate 14 is provided between the upper container 12a and the lower container 12b. The partition plate 14 is attached so that the upper surface of the peripheral edge portion of conductive material fixing portion 22, the under surface of which presses the upper surface of the peripheral edge portion of the partition plate 14, contacts with a lower insulating member 21b of insulating members 21a and 21b provided between the upper container 12a and the conductive material fixing portion 22. And the electrode 20 is provided on the lower insulating member 21b. As a result, the plasma generating space 15 and the film forming space 16 separated from each other are formed on the upper side and the lower side of the partition plate 14, respectively. The partition plate 14 and the upper container 12a form the plasma generating space 15.

FIG. 1 shows the first embodiment of the RS-CVD system employed for the silicon oxide film formation method according to the present invention. In this RS-CVD system, a region in which plasmas 19 are generated in the plasma generating space 15 comprises the partition plate 14, the upper container 12a and a flat electrode (high frequency electrode) 20 which is arranged almost at an intermediate position between the partition plate 14 and the upper container 12a. A plurality of holes 20a are formed in the electrode 20. The partition plate 14 and the electrode 20 are supported and fixed by the two insulating members 21a and 21b provided along the inner surface of the side of the upper container 12a. A power introduction rod 29 connected to the electrode 20 is provided on the ceiling of the upper container 12a. The power introduction rod 29 supplies high frequency discharge power to the electrode 20. The electrode 20 functions as a high frequency electrode. The power introduction rod 29 is covered with an insulator 31 to be insulated from the other metallic portions.

The partition plate 14 is set at a ground potential 41 through a conductive material fixing portion 22.

An oxygen gas introduction pipe 23a for introducing oxygen gas from the outside into the plasma generating space 15 and a cleaning gas introduction pipe 23b for introducing clean gas such as fluoride gas are provided at the insulating member 21a.

The interior of the vacuum container 12 is separated into the plasma generating space 15 and the film forming space 16 by the partition plate 14. A plurality of penetrating holes 25 of specific dimensions (length, diameter and the like) and structure as to prevent material gas introduced into the film forming space 16 from inversely diffusing to the plasma generating space 15 are uniformly formed in the partition plate 14 where the inner space 24 is not provided. The plasma generating space 15 and the film forming space 16 are communicated with each other only through these penetrating holes 25.

That is, the dimensions and structure of each of these penetrating holes 25 satisfy the condition of uL/D>1 proposed in the above-stated Japanese Patent Unexamined Application Publication No. 2000-345349, which is the prior patent application to this application.

Figure 3:
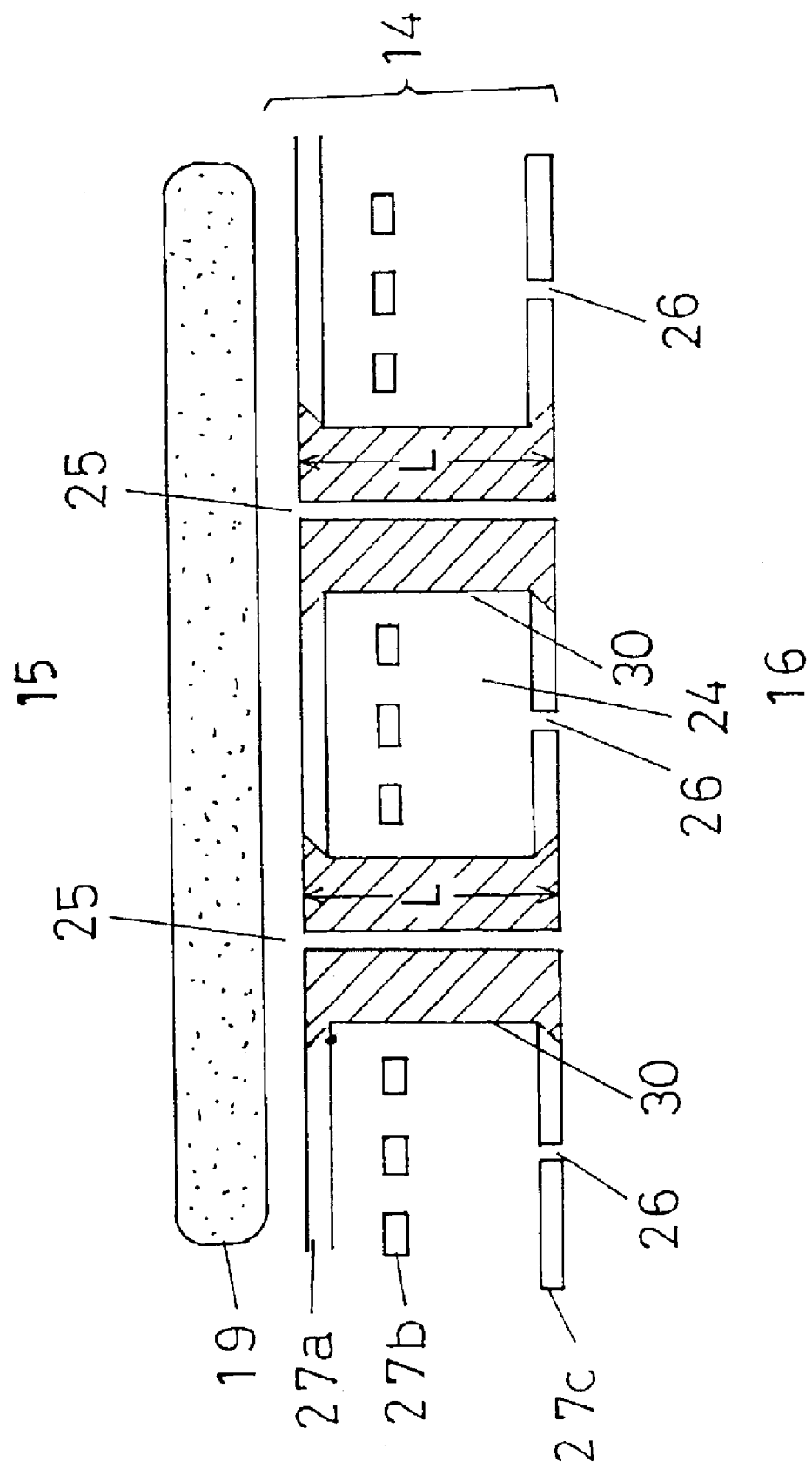
FIG. 3 is a cross-sectional view for explaining an example of the shape of the penetrating hole formed in a partition plate.
Figure 4:
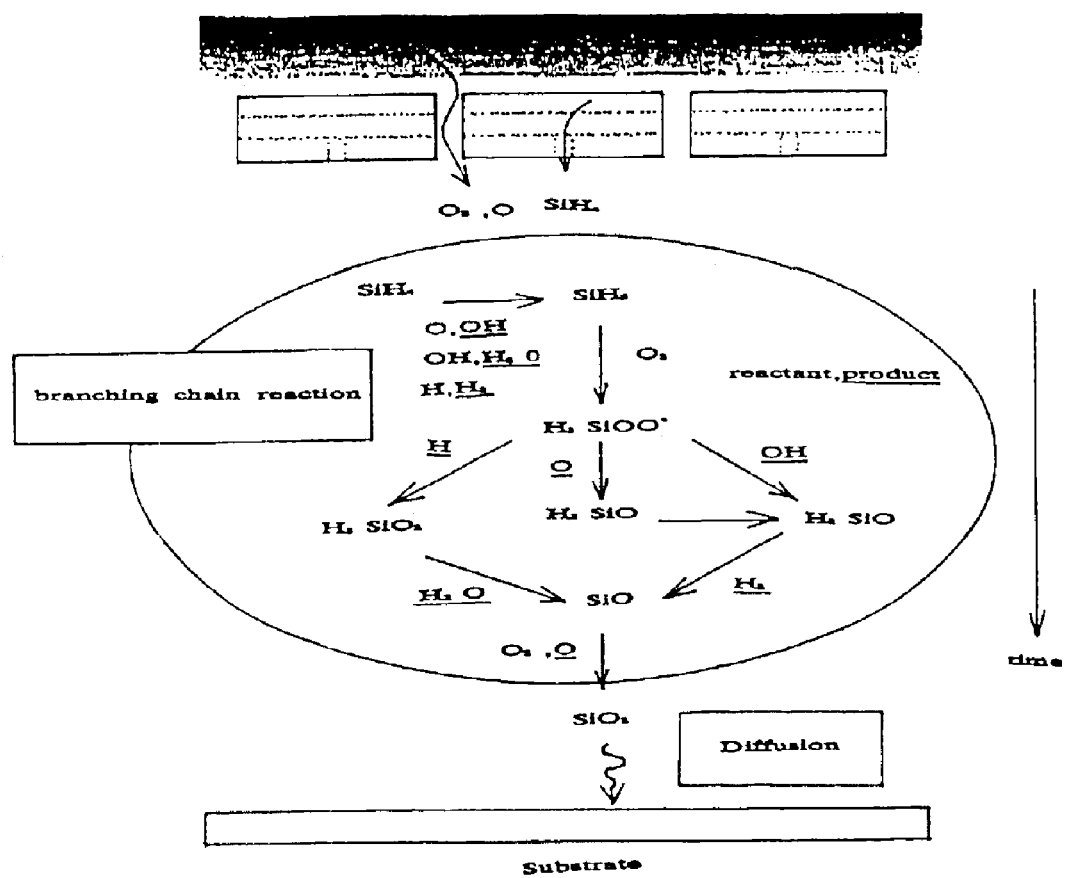
FIG. 4 is a typical view for explaining reactions in forming a silicon oxide film which occur in a film forming space of the RS-CVD system.
Figure 5:
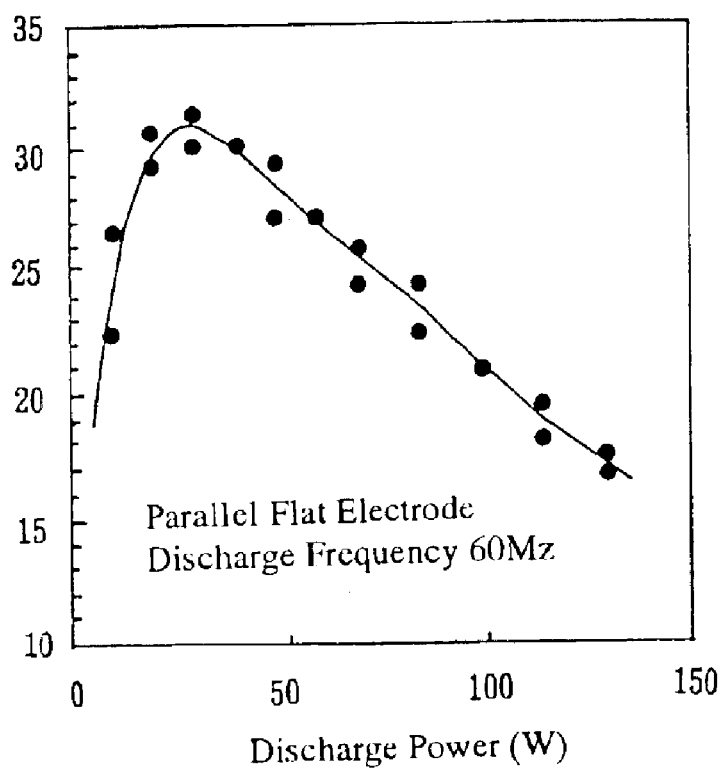
FIG. 5 shows the dependency of the flow rate of atomic oxygen, flowing from a plasma generating space to a film formation space and measured in the film formation space, on discharge power.

In the condition expression, symbol u denotes gas flow velocity in the penetrating hole 25, i.e., the flow velocity in the penetration hole 25 of gas, e.g., oxygen gas, which generates radicals and contributes to film formation. Symbol L denotes the substantial length of the penetrating hole 25 as shown in FIG. 3. Symbol D denotes a binary diffusivity, i.e., the mutual gas diffusion coefficient of two types of gases (material gas such as silane gas and gas such as oxygen gas introduced into the plasma generating space 15, generating radicals and contributing to film formation).

In the following, the mechanism by which the material gas does not diffuse reversely to the plasma generating space 15 is explained.

When a film is formed by using the before described CVD system (RS-CVD system), the glass substrate 11 is transferred into the vacuum container 12 by means of a transfer robot (not shown in the drawings) and is disposed on the substrate holding mechanism 17. The inside of the vacuum container 12 is evacuated by means of the exhaust mechanism 13 and the pressure is reduced and maintained at a predetermined vacuum state. Next, oxygen gas is fed through the oxygen gas lead-in pipe 23a into the plasma generating space 15 of the vacuum container 12.

The mass flow rate of the oxygen gas at this time is controlled by means of an external mass flow controller (not shown in the drawings).

On the other hand, material gas, for example, silane is led into an inner space 24 of the partition plate 14 through a material gas lead-in pipe 28, and led into the film forming space 16 through diffusion holes 26.

The flow velocity (u) of the oxygen can be obtained using the below described expressions (1) and (2), based on oxygen mass flow rate ($Qo_{O_2}$), pressure ($Po_{O_2}$), and temperature (T) of partition wall section:

$$Qo_{O_2} = \rho o_{O_2} uA \quad (1)$$

$$Po_{O_2} = \rho o_{O_2} RT/M \quad (2)$$

Where $\rho o_{O_2}$: Density of oxygen gas
  M: Molecular weight of oxygen
  R: Universal gas constant
  T: Absolute temperature of the partition wall section
  A: Total cross sectional area of the smallest diameter portion of the penetration holes 25 formed in the partition plate 14
  u: Flow velocity of the oxygen gas flowing through the penetration holes 25

The relation uL/D>1 is derived as follows. For example, regarding the relation between the oxygen and the silane that are transferring through the penetration holes 25, an expression (3) shown below is established by using the silane gas density ($\rho o_{SiH_4}$), diffusion flow velocity ($o_{USiH_4}$), and the binary diffusivity ($Do_{SiH_4-oO_2}$). When the characteristic length of the penetration holes (the length of the portion of the minimum diameter) is represented by L, the expression (3) can be approximated by expression (4). As a result of a comparison between both sides of the expression (4), the diffusion flow velocity ($o_{USiH_4}$) of the silane is expressed by $-Do_{SiH_4}-o_{O_2}/L$. Therefore, the oxygen flow velocity, as obtained from the above expressions (1) and (2), is represented by u, and the diffusion flow velocity of the silane is represented by $-Do_{SiH_4}-o_{O_2}/L$. The ratio between the absolute values of these two flow velocity values is the value of $|-u/(Do_{SiH_4}-o_{O_2}/L)=uL/Do_{SiH_4}-o_{O_2}$, which represents the ratio between the flow velocity of oxygen and the diffusion velocity of silane. Setting the value of $uL/Do_{SiH_4-O_2}$ to exceed 1 means that the flow velocity of oxygen due to convection is greater than the diffusion velocity of silane. That is, the arrangement of the value of $uL/Do_{SiH_4}-o_{O_2}$ to exceed 1 means that the diffusion influence of silane is less, and the silane should not pass through the penetration holes 25.

$$\rho o_{SiH_4} U o_{SiH_4} = -Do_{SiH_4}-o_{O_2} \mathrm{grad} \rho o_{SiH_4} \quad (3)$$

$$\rho o_{SiH_4} U_{SiH_4} \approx -Do_{SiH_4}-o_{O_2} \rho o_{SiH_4}/L \quad (4)$$

Next, a particular example is described below. The above expressions will produce a value of $uL/DSiH_4-o_2$ as equal to about 11 in the following case: the temperature in the partition plate 14 is 300° C., the smallest diameter of the penetration holes 25 formed in the partition plate 14 is 0.5 mm, the length (L) of a portion of the diameter 0.5 mm is 3 mm, the total number of penetration holes 25 is 500, the flow rate of oxygen gas is 500 sccm (=500 cm³/minute at the normal state), and the pressure in the film forming space 16 is 100 Pa. This indicates that, since the flow influence is very large compared with the diffusion of the silane gas, the diffusion of the silane gas into the plasma generating space 15 is reduced.

FIG. 3 is a schematic enlarged view of the internal structure of the partition plate 14 viewed from the cross-sectional direction thereof.

The inner space 24 formed in the partition plate 14 is a space for diffusing the material gas introduced from the outside into the partition plate 14 and uniformly supplying the material gas to the film forming space 16. In addition, a plurality of diffusion holes 26 for supplying the material gas to the film forming space 16 are formed in the lower plate 27c of the partition plate 14.

A material gas introduction pipe 28 for introducing the material gas from the outside is connected to the inner space 24 (see FIGS. 1 and 2). The material gas introduction pipe 28 is arranged to be connected to the side of the partition plate 14.

Further, the interior of the inner space 24 is separated into two spaces, i.e., upper and lower spaces by a uniform plate 27b into which a plurality of holes are formed so as to uniformly supply the material gas from the diffusion holes 26.

Therefore, the material gas introduced into the inner space 24 of the partition plate 14 by the material gas introduction pipe 28 is introduced into the upper space, passed through the holes of the uniform plate 27b into the lower space, and further passed through the diffusion holes 26 to diffuse into the film forming space 16.

It is thus possible to uniformly supply the material gas to the entire film forming space 16 based on the above-stated structure. However, as long as the material gas can be uniformly supplied to the entire film forming space 16, the internal structure of the partition plate 14 is not limited to the above structure.

FIG. 2 shows the second embodiment of the RS-CVD system employed for the silicon oxide film formation method according to the present invention. The constitution of the embodiment shown in FIG. 2 is characterized in that an insulating member 21a is provided inside of the ceiling of the upper container 12a and the electrode 20 is arranged below the insulating member 21a. Unlike the first embodiment shown in FIG. 1, holes 20a are not formed in the electrode 20 and the electrode 20 is flat. The electrode 20 and the partition plate 14 form the plasma generating space 15 to have a parallel plate electrode structure. The remaining constitution is substantially the same as that of the first embodiment. Therefore, in FIG. 2, the same reference symbols denote substantially the same constituent elements as those in FIG. 1, respectively, and will not be repeatedly described herein. Further, the function and advantage of the RS-CVD system in the second embodiment are the same as those in the first embodiment.

The silicon oxide film formation method according to the present invention by employing the RS-CVD system constituted as stated above will now be described.

The glass substrate 11 is carried into the vacuum container 12 by a carrier robot, not shown, and disposed on the substrate holding mechanism 17. The vacuum container 12 is evacuated by the exhaust mechanism 13 and the pressure of the container 12 is reduced to hold a predetermined vacuum state.

$N_2O$ gas or $N_2$ gas-added oxygen gas is then introduced into the plasma generating space 15 of the vacuum container 12 through the oxygen gas introduction pipe 23a. The quantity of this $N_2O$ gas or $N_2$ gas added to the oxygen gas is regulated by a flow rate controller, not shown.

On the other hand, the material gas, e.g., silane gas is introduced into the inner space 24 of the partition plate 14 through the material gas introduction pipe 28. The silane gas is first introduced into the upper portion of the inner space 24, made uniform through the uniform plate 27b, moved to the lower portion thereof, and then directly introduced into the film forming space 16 through the diffusion holes 26, i.e., without contacting with plasmas. The substrate holding mechanism 17 provided in the film forming space 16 is held at a predetermined temperature in advance since the heater 18 is actuated.

In this state, high frequency power is supplied to the electrode 20 through the power introduction rod 29. This high frequency power generates discharge, and oxygen plasmas 19 are generated around the electrode 20 in the plasma generating space 15. By generating the oxygen plasmas 19, radicals (excited active species), which are electrically neutral excited species, are generated, passed through the penetrating holes 25 and introduced into the film forming space 16, while the material gas is introduced into the film forming space 16 through the inner space 24 and the diffusion holes 26 of the partition plate 14. As a result, the radicals contact with the material gas for the first time in the film forming space 16, causing a chemical reaction therebetween, depositing a silicon oxide on the surface of the glass substrate 11 and thereby forming a thin film.

Figure 6:
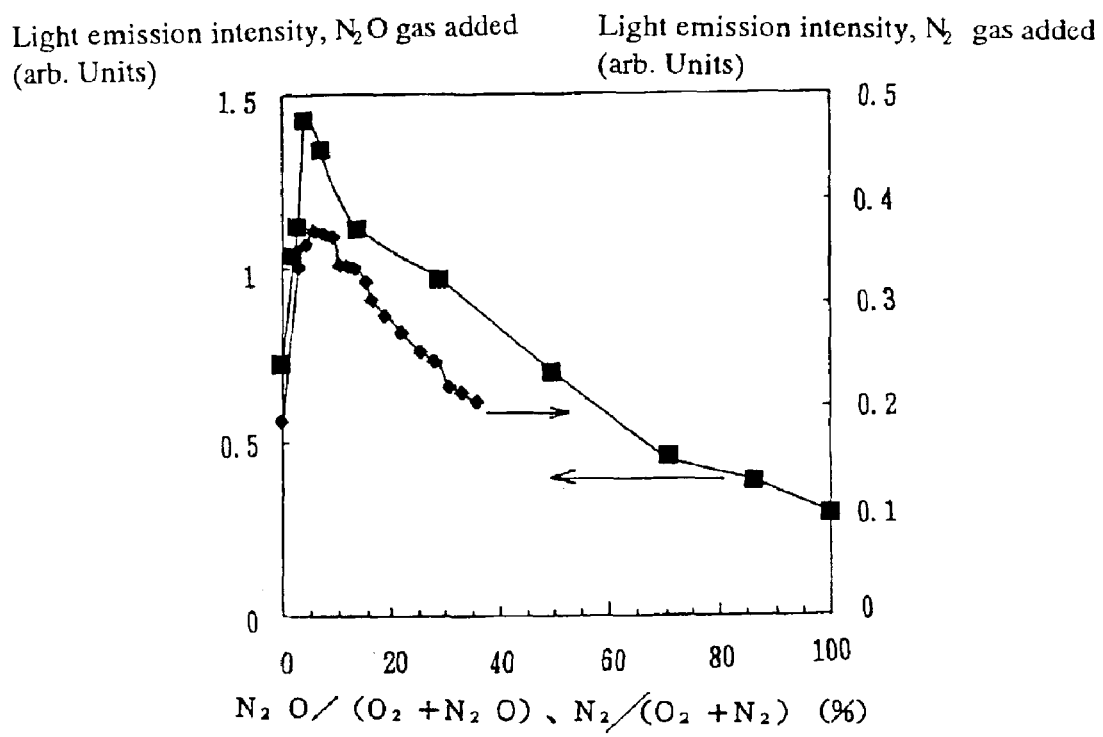
FIG. 6 shows the relationship between the ratios of the flow rate of nitrous oxide gas and nitrogen gas introduced into the plasma generating space to the total flow rate of oxygen and the above-mentioned nitrogen containing gas and the intensities of light emitted from atomic oxygen.

FIG. 6 shows the relationship between the ratios (%) of the flow rate of the nitrous oxide ($N_2O$) gas or that of the nitrogen gas ($N_2$) gas introduced into the plasma generating space together with the oxygen gas to the total flow rate of the oxygen gas and the above-mentioned nitrogen containing gas and the intensities of light emitted from the atomic oxygen in the silicon oxide film formation method according to the present invention.

As can be seen from FIG. 6, the intensity of the light emitted from the atomic oxygen has similar tendencies between the nitrous oxide ($N_2O$) gas and the nitrogen ($N_2$) gas. Namely, if the flow amount of the added nitrous oxide ($N_2O$) gas or the nitrogen gas ($N_2$) gas is not more than 20% relative to that of the oxygen gas, the light emission intensity is higher than that if the flow amount of the nitrous oxide ($N_2O$) gas or the nitrogen gas ($N_2$) gas is higher than 20%. If the flow amount of the added nitrous oxide ($N_2O$) gas or nitrogen gas ($N_2$) gas is about 5 to 7% relative to that of the oxygen gas, the light emission intensity reaches a maximum (which is nearly twice as high as that if the added nitrous oxide ($N_2O$) gas or nitrogen ($N_2$) gas is not added).

Namely, by adding not more than 20% of nitrous gas or nitrogen gas to the oxygen gas, the quantity of generated atomic oxygen increases. If the quantity of added nitrous gas or nitrogen gas is about 5 to 7% relative to that of the oxygen gas, the quantity of generated atomic oxygen increases to a maximum of nearly twice as much as that without adding nitrous gas or nitrogen gas.

In this way, under the conditions that the high frequency power applied to the plasma generating space and the flow amount of oxygen introduced into the plasma generating space, both of which vary from individual film formation apparatus (RS-CVD systems) to individual film formation apparatus, are set at the optimized parameters, if a slight amount of nitrous oxide gas or nitrogen gas at the above-stated ratio according to the present invention is added, then it is possible to further increase the quantity of atomic oxygen which exceeds the conventional quantity of atomic oxygen in the case where the nitrous gas or nitrogen gas is not added to the oxygen gas.

Figure 7:
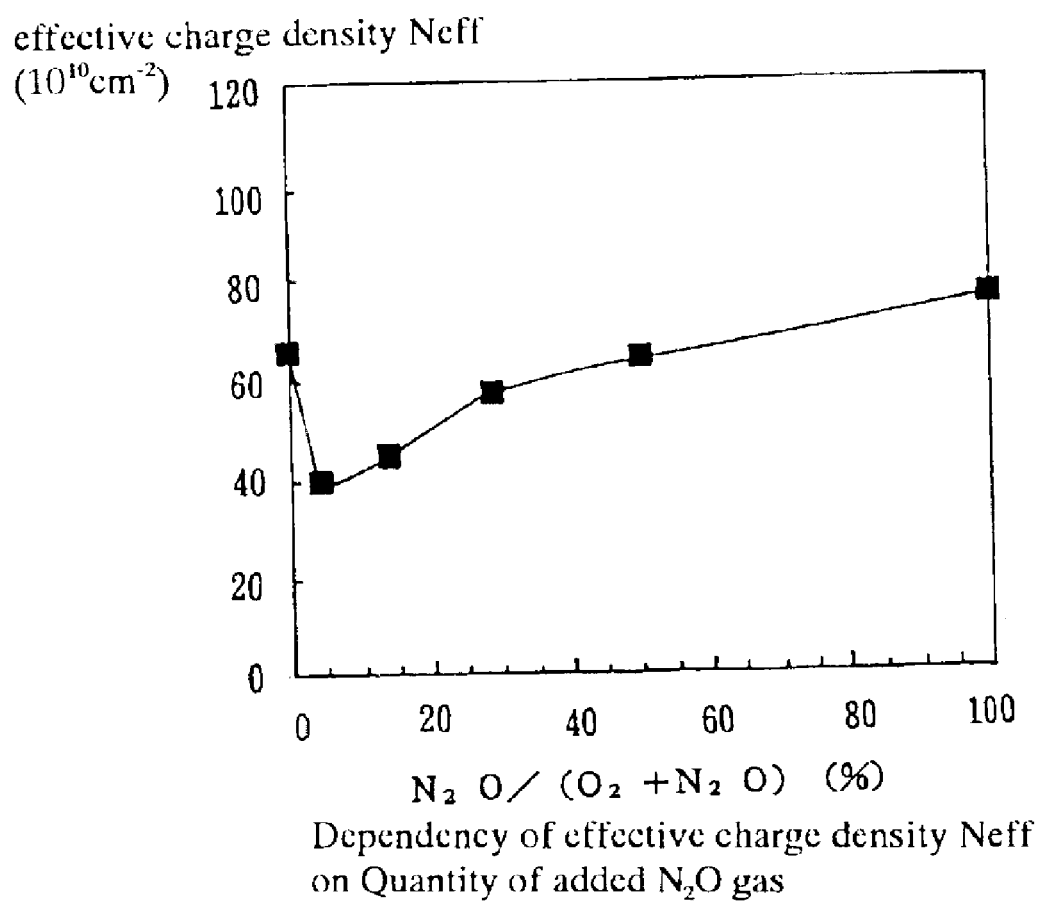
FIG. 7 shows the dependency of effective charge density Neff on the the ratio of nitrous oxide gas flow rate to the total flow rate of oxygen and nitrous oxide gas.

FIG. 7 is a graph showing the dependency of effective charge density Neff on the ratio of added nitrous oxide ($N_2O$) gas to the total flow rate of oxygen and nitrous oxide gas. The effective charge density Neff is one index used to evaluate the film quality of the silicon oxide film and a factor which has an effect on the electric properties of the silicon oxide film when the film is incorporated into a device. It is normally said that the lower the effective charge density Neff is, the better the silicon oxide film becomes.

As is obvious from the comparison between FIGS. 6 and 7 for the nitrous oxide, the effective charge density Neff tends to be lower if the ratio of added nitrous oxide gas flow rate to oxygen gas flow rate is not more than 20%, and the effective charge density Neff becomes the lowest in a region in which the intensity of light emitted from the atomic oxygen becomes the highest, i.e., if the ratio of added nitrous oxide gas or nitrogen gas flow rate to oxygen gas flow rate is 5 to 7%.

This indicates that if not more than 20%, preferably 5 to 7%, of the nitrous oxide gas or nitrogen gas is added to the oxygen gas introduced into the plasma generating space, the quantity of atomic oxygen increases and that the film quality of the silicon oxide film improves from that in the case where no nitrous oxide gas or nitrogen gas is added to the oxygen gas.

In the before described embodiments, the case of using $O_2$ gas as oxygen atom containing gas and using $N_2O$ gas or $N_2$ gas added to the $O_2$ gas as nitrogen atom containing gas has been described. It is also possible to use $O_3$ gas or the like as the oxygen atom containing gas and to use NO gas, $NO_2$ gas or the like as the nitrogen atom containing gas.

The preferred embodiments of the present invention have been described so far. However, the present invention is not limited to these embodiments but can be changed in various manners within the technical scope of the invention understood from claims which follow.

What is claimed is:

1. A silicon oxide film formation method using a CVD system having a vacuum container separated into two compartments by a conductive partition plate, one of the compartments forming a plasma generating space containing a high frequency electrode and the other compartment forming a film forming space containing a substrate holding mechanism for holding substrates, the conductive partition plate having plural penetration holes for communicating between the plasma generating space and the film forming space and an inner space separated from the plasma generating space and communicating with the film forming space through plural diffusion holes, said method comprising:

supplying a material gas into the inner space of the conductive partition plate and introducing the material gas into the film forming space through plural diffusion holes;

applying high frequency electric power to the high frequency electrode to generate plasma discharge in the plasma generating space and introducing products produced by the plasma in the plasma generating space into the film forming space through plural penetration holes in the conductive partition plate; and forming a silicon oxide film on a substrate held by the substrate holding mechanism with the products and the material gas;

wherein, during said applying, oxygen atom containing gas and nitrogen atom containing gas are introduced into the plasma generating space to generate the plasma discharge, the nitrogen atom containing gas is introduced together with the oxygen containing gas and is mixed into the oxygen atom containing gas at a flow rate ratio of not more than 20%, the oxygen atom containing gas is one of $O_2$ and $O_3$, and the nitrogen atom containing gas is one of NO, $N_2O$ and $NO_2$.

2. The method of claim 1, wherein the flow rate ratio of the nitrogen atom containing gas is not more than 5 to 7%.

3. The method of claim 2, wherein the products generated in the plasma generating space by generating the plasma discharge are radicals.

4. The method of claim 1, wherein the products generated in the plasma generating space by generating the plasma discharge are radicals.

* * * * *